(12) United States Patent
Hsu

(10) Patent No.: US 6,184,050 B1
(45) Date of Patent: Feb. 6, 2001

(54) METHOD FOR FORMING A PHOTODIODE

(75) Inventor: Jen-Yao Hsu, Hsinchu Hsien (TW)

(73) Assignee: United Microelectronics Corp., Hsinchu (TW)

( * ) Notice: Under 35 U.S.C. 154(b), the term of this patent shall be extended for 0 days.

(21) Appl. No.: 09/206,857

(22) Filed: Dec. 8, 1998

(51) Int. Cl.⁷ .................................................. H01L 21/00
(52) U.S. Cl. ............................. 438/45; 438/22; 438/443; 438/450; 438/923; 438/981
(58) Field of Search .................................. 438/439, 443, 438/450, 923, 981, 22, 45, 162; 148/DIG. 35

(56) References Cited

U.S. PATENT DOCUMENTS

| | | |
|---|---|---|
| 4,984,047 | * 1/1991 | Stevens . |
| 5,679,602 | * 10/1997 | Lin et al. . |
| 5,853,626 | * 12/1998 | Kato ............................... 264/1.25 |

FOREIGN PATENT DOCUMENTS

| | | | |
|---|---|---|---|
| 353031978 | * | 3/1978 | (JP) .............................. 438/FOR 162 |
| 356048168 | * | 5/1981 | (JP) .............................. 438/FOR 162 |
| 362120018 | * | 6/1987 | (JP) .............................. 438/FOR 162 |
| 401283944 | * | 11/1989 | (JP) . |

* cited by examiner

*Primary Examiner*—Long Pham

(57) ABSTRACT

A method for forming a photodiode is provided. A substrate having a well with a first electric type therein is provided. An insulating layer is formed on the substrate. The insulating layer is patterned to form an opening. The insulating layer still remains with a thin thickness below the bottom of the opening. A heavily doped region with a second electric type is formed in the well in the position below the opening. A junction is thus formed between the heavily doped region and the well.

2 Claims, 3 Drawing Sheets

METHOD FOR FORMING A PHOTODIODE

BACKGROUND OF THE INVENTION

1. Field of the Invention

The invention relates in general to the fabrication of semiconductor integrated circuits (ICs), and more particularly to a method for forming a photodiode.

2. Description of the Related Art

A photodiode is a light-sensitive semiconductor device having a P-N junction that coverts light into an electrical signal (also known as a photo-detecting device). Due to the presence of an electric field at the P-N junction, electrons in the N-doped layer and holes in the P-doped layer cannot normally diffuse across the junction in the absence of light. However, when sufficient light falls on the P-N junction, electron-hole pairs are generated by energy from the light. These electrons and holes are able to diffuse towards the junction. Due to the presence of an electric field at the junction, electrons will separate out towards the N-side and holes will separate out towards the P-side of the junction and accumulate there. Therefore, a current is able to flow across the P-N junction. Ideally, a photodiode should remain in open-circuit condition in the dark until light is shone on the junction.

In general, photodiode devices are used as imaging sensors in different types of equipment, for example, PC cameras and digital cameras. One major defect of a conventional photodiode is its relatively large junction leakage current. Junction leakage current often leads to the build-up of a large dark current in products that employ a large number of imaging sensors. Furthermore, the large dark current is capable of producing abnormal bright spots on an imaging screen.

FIGS. 1A–1C are schematic, cross-sectional views showing the process of forming a conventional photodiode.

In FIG. 1A, a substrate 100 having a pad oxide layer 102 thereon is provided. The pad oxide layer 102 is used as sacrificial layer to protect the substrate 100 form being destroyed during following steps. A patterned silicon nitride layer ($Si_3N_4$) 104 is formed on the pad oxide layer 102. An ion implantation $I_1$ is performed to form a P-well 106 in the substrate 100.

In FIG. 1B, the silicon nitride layer 104 is used as a mask in a local oxidation of silicon (LOCOS) operation. The LOCOS operation is carried out in an atmosphere comprising oxygen (O), such as water vapor or $O_2$, to form a field oxide (FOX) layer 108 in the substrate 100. In other words, an insulating layer is formed surrounding a device region.

Since water vapor and oxygen cannot penetrate the silicon nitride layer 104 easily, the field oxide layer 108 does not form in regions covered by the silicon nitride layer 104. However, water vapor and oxygen still can diffuse horizontally into the substrate 100 at the edges of the silicon nitride layer 104. Bird's beaks 110 are formed at the edge of the field oxide layer 108.

In FIG. 1C, a wet etching is carried out to remove the silicon nitride layer 104 and the pad oxide layer 102 between the field oxide layer 108. An $N^+$-doped region 110 is formed in the P-well 106 by an ion implantation $I_2$. The $N^+$ means that the doped region has a heavy N-type dopant. The $N^+$-doped region 110 is annealed to drive the implanted N-type ions into the P-well 106. A P-N junction forms between the $N^+$-doped region 110 and the P-well 106, so that a photodiode device is thus completed.

However, in the conventional photodiode device described above, bird's beaks form on each side of the field oxide layer of the device structure. Since stress at the bird's beaks is higher and more crystal defects occur from the stress at the bird's beaks than at other portion of the device structure, a large junction leakage current is generated there. A unit of imaging equipment that employs a large number of photodiodes thus has a large leakage current and produces a large dark current that results in abnormal bright spots on an imaging screen.

SUMMARY OF THE INVENTION

It is therefore an object of the invention to provide an improved method for forming a photodiode to prevent the leakage current, which forms at the junction of a conventional photodiode, from occurring. The defects of the conventional photodiode, such as a large dark current and abnormal bright spots are thus avoided.

To achieve these and other advantages and in accordance with the purpose of the invention, as embodied and broadly described herein, the invention provides a method for forming a photodiode. A substrate having a well with a first electric type therein is provided. An insulating layer is formed on the substrate. The insulating layer is patterned to form an opening. The insulating layer still remains with a thin thickness below the bottom of the opening. A heavily doped region with a second electric type is formed in the well in the position below the opening. A junction is thus formed between the heavily doped region and the well.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1A:
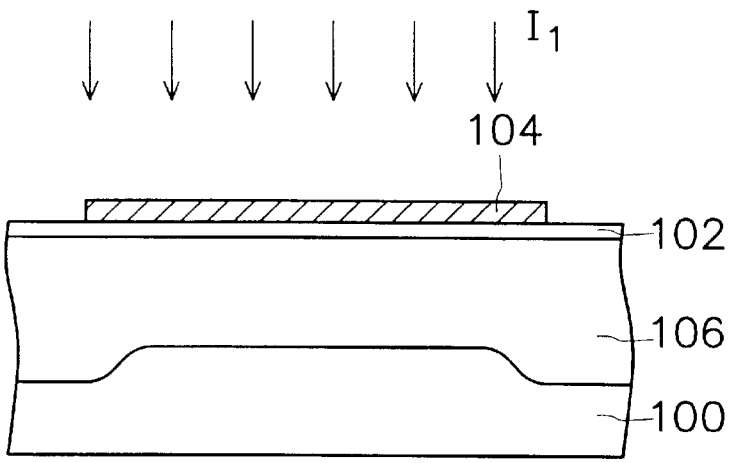
FIGS. 1A–1C are schematic, cross-sectional views showing the process of forming a conventional photodiode.
Figure 1B:
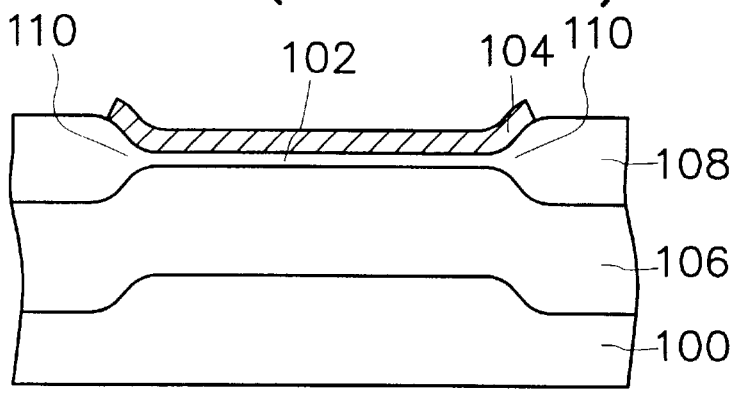
Figure 1C:
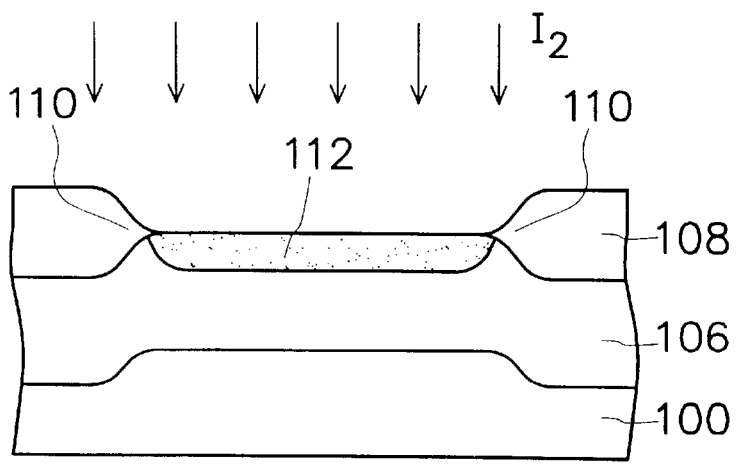
Figure 2A:
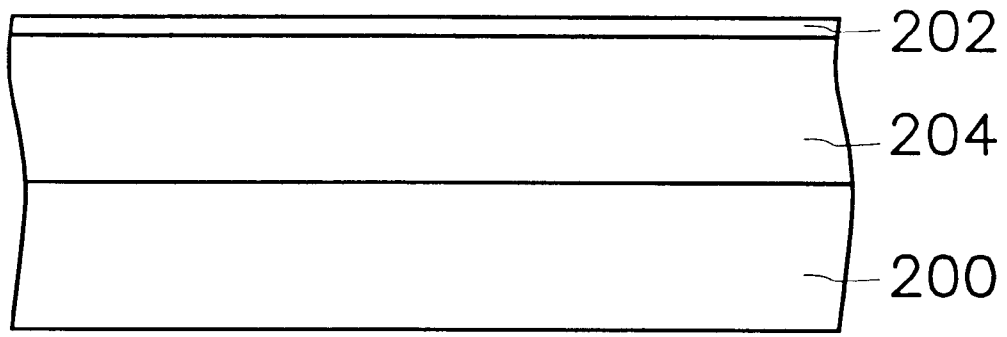
FIGS. 2A–2D are schematic, cross-sectional views showing the process of forming a photodiode according to one preferred embodiment of the invention.

In FIG. 2A, a substrate 200 having a pad oxide layer 202 thereon is provided. The substrate 200 can be, for example, a substrate with a first electric type or a well with the first type on a substrate with a second electric type. The first electric type and the second electric type are inverses of each other. For example, if the first electric type represents P-type, the second electric type represents N-type. On the other hand, if the first electric type represents N-type, the second electric type thus represents P-type. In FIG. 2A, the substrate 200 comprises a well 204 therein. The well 204 is formed, for example, by ion implanting.

Figure 2B:
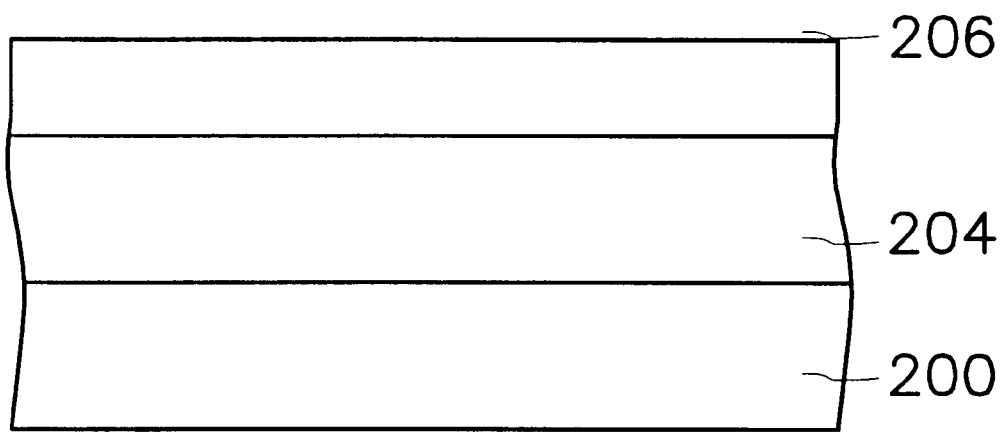

In FIG. 2B, an insulating layer 206, such as a silicon oxide layer, is formed on the well 204 and over the substrate 200. The insulating layer 206 is formed, for example, by thermal oxidation in an atmosphere comprising oxygen (O), such as water.

Figure 2C:
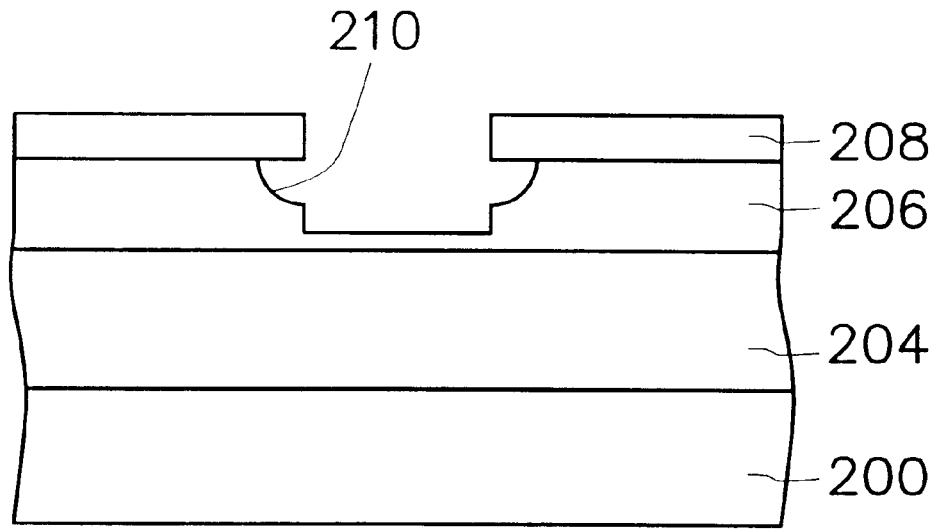

In FIG. 2C, a defined photoresist layer 208 is formed on the insulating layer 206. A portion of the insulating layer 206 is removed with the defined photoresist layer 208 to form a opening 210 within the insulating layer 206. The opening 210 is formed, for example, using wet etching or using fully dry etching. At the bottom of the opening 210, the remaining insulating layer 206 has a thickness less than 3000 Å.

Figure 2D:
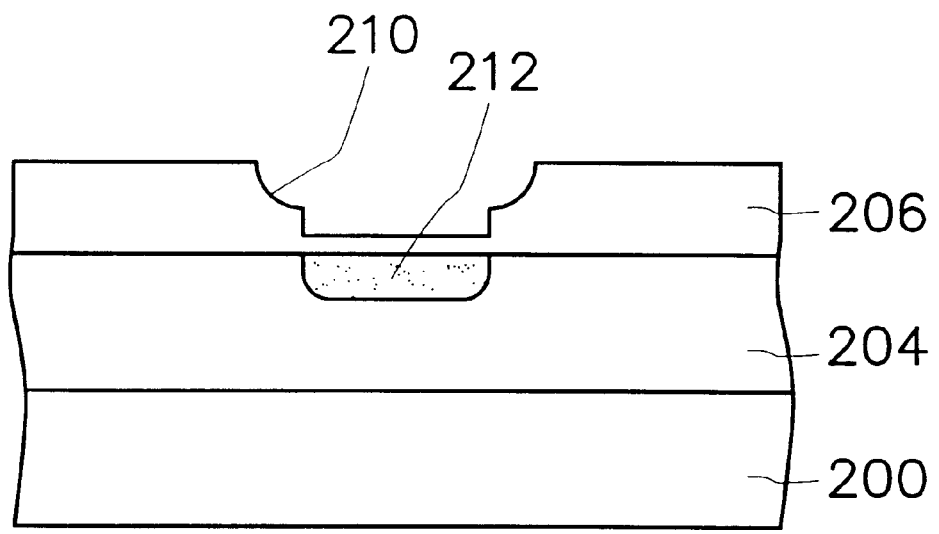

In FIG. 2D, a heavily doped region 212 is formed in the top portion of the well 204 in the position below the opening 210 using the photoresist layer 208 and the insulating layer 206 as a mask. The heavily doped region 212 has the second electric type, which is the inverse of the first electric type of the well. The heavily doped region 212 is formed, for example, by ion implanting with a tilt angle of less than about 60 degrees and with an energy of about 30–560 Kev. Dopants of the heavily doped region 212 comprise arsenic (As) or phosphorus (P) when the heavily doped region 212 is an $N^+$-doped region. Dopants of the heavily doped region 212 comprise boron (B) or boron fluoride ($BF_2$) when the heavily doped region 212 is a $P^+$-doped region. The dopant of the heavily doped region 212 has a dosage of about $10^{12}$–$10^{16}$/$cm^2$. The photoresist layer 208 is removed after ion implanting. Since the electric type of the well 204 and the electric type of the doped region 212 are inverses, a P-N junction that is used as a photodiode is thus formed between the well 204 and the doped region 212.

One feature of the invention is that the heavily doped region is formed in a position below the opening. There is no any bird's beak near the heavily doped region so that the leakage current is avoided.

Another feature of the invention is that the well is formed under the pad oxide layer without the silicon nitride layer as formed in a conventional method. Since the silicon nitride layer interferes with ions diffusing into the substrate while performing the implantation, a portion of the well under the silicon nitride layer is shallower than other portions of the well. The well of the invention has a smooth profile without the silicon nitride layer.

Still another feature of the invention is that a thin insulating layer remains under the opening. The remaining insulating layer can prevent the surface of the well from being destroyed while forming the heavily doped region in the well.

Yet another feature of the invention is that the heavily doped region is formed using a photoresist layer and the insulating layer with an opening as a mask. The position of the doped region can be easily adjusted by changing the position of the opening in the insulating layer. Furthermore, the dosage of the doped region, implanting energy, kind of dopant in the doped region and the implanting angle can be adjusted according to actual applications without affecting other devices.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for forming a photodiode, comprising the steps of:

providing a substrate with a pad oxide layer thereon;

forming a well with a first electric type in the substrate under the pad oxide layer;

forming a field oxide layer on the substrate;

forming an opening in the field oxide layer above the well, wherein a depth of the opening is less than a thickness of the field oxide layer; and performing an ion implanting process to form a heavily doped region with a second electric type in the well under the opening, wherein the ion implanting process is performed with a tilt angle of less than 60 degrees and with an energy of about 30–560 Kev.

2. A method for forming a photodiode, comprising the steps of:

providing a substrate with a first electric type;

forming an insulating layer on the substrate;

forming an opening in the insulating layer, wherein a depth of the opening is less than a thickness of the insulating layer; and performing an ion implanting process to form a heavily doped region with a second electric type in the substrate under the opening, wherein the ion implanting process is performed with a tilt angle of less than 60 degrees and with an energy of about 30–560 Kev.

* * * * *